United States Patent [19]

Ijntema et al.

[11] Patent Number: 4,775,827

[45] Date of Patent: Oct. 4, 1988

[54] DEVICE FOR INDICATING THE CHARGE STATUS OF A BATTERY

[75] Inventors: Johannes Ijntema, Drachten; Jouw Van Den Akker, Nijmegen; Jacob F. Verrij, Drachten; Lambert J. H. Folmer, Nijmegen, all of Netherlands; Teruo Hishiki, Tokyo, Japan

[73] Assignee: U.S. Philips Corporation, New York, N.Y.

[21] Appl. No.: 46,977

[22] Filed: May 5, 1987

[30] Foreign Application Priority Data

May 15, 1986 [NL] Netherlands ............... 8601243

[51] Int. Cl.[4] ............................................. H02J 7/04
[52] U.S. Cl. .......................................... 320/44; 320/5; 320/35; 320/48
[58] Field of Search ........................ 320/5, 35, 44, 48

[56] References Cited

U.S. PATENT DOCUMENTS

4,387,334  6/1983  Loper ................................. 320/44
4,553,081  12/1985  Koenck ............................ 320/35 X
4,638,237  1/1987  Fernandez ......................... 320/48

Primary Examiner—Patrick R. Salce
Assistant Examiner—Anita M. Ault
Attorney, Agent, or Firm—Thomas A. Briody; David R. Treacy; Bernard Franzblau

[57] ABSTRACT

A device for determining the charge status of a battery (4) when it is discharged by a load ($R_L$) and/or when it is charged by a power-supply circuit (1) in which a value representing the nominal charging time and discharging time respectively is stored in first (10) and second adjusting means (11) respectively and is applied to computing means (12). In response to clock pulses applied to the computing means by a clock means (13), the computing means calculate the charge status of the battery by expressing the elapsed discharging or charging time as a fraction of the adjusted discharging time and charging time respectively. The computed charge status is indicated by indicator means (14). During discharging and charging an actual charge status is detected by first (7) and second (16) detection means. In the case of a difference between the computed and the actual charge status, correction means (15) corrects the computed charge status and the value stored in the adjusting means (10, 11) is updated so that during a subsequent discharging or charging cycle the computed charge status conforms more closely to the actual charge status.

23 Claims, 5 Drawing Sheets

DEVICE FOR INDICATING THE CHARGE STATUS OF A BATTERY

BACKGROUND OF THE INVENTION

This invention relates to a device for indicating the charge status of a battery during charging and/or discharging, comprising:

a power-supply circuit for charging the battery and/or energizing a load;

means for generating pulses during charging and/or discharging of the battery;

computing means for computing the charge status on the basis of the generated pulses, and indicator means for indicating the computed charge status.

Such a device is suitable for use in rechargeable apparatuses, in particular in rechargeable electronic showers.

Such a device is known from German patent application No. 2,313,566. During charging and discharging of the battery this device measures the charging and discharging currents by means of a resistor connected in series with the battery. The voltage across this resistor is amplified and then integrated, the gain and the integration constant during discharging being different from those during charging of the battery. The integrated voltage is compared with a reference voltage and each time that this reference voltage is reached a pulse is generated. These pulses are supplied to a counter whose count is displayed by means of an indicator which indicates the charge status of the battery. When the battery is discharged a warning signal is generated as soon as a specific count is reached and after a certain time the load is disconnected from the battery to preclude complete discharging of the battery. During charging of the battery the charging circuit is disconnected when a maximum count is reached to prevent the battery from becoming overcharged.

A disadvantage of this known device is that for determining the charge status it is necessary to connect a resistor in series with the load between the battery terminals. As a result of this the known device is not suitable for use in, for example, a rechargeable electronic shaver, in which the load is constituted by a motor. When this motor is energized by the battery, the voltage drop across the resistor should be very small, because otherwise the motor characteristic will be affected adversely. To avoid this adverse effect the resistor should be of such a low value that handling the voltage across this resistor presents major problems. Moreover, the known device does not allow for deviations from the nominal capacity of the battery, for example as a result of ageing.

SUMMARY OF THE INVENTION

It is an object of the invention to provide a device which enables an accurate indication of the charge status of a battery to be obtained without directly measuring the charging and discharging currents. According to the invention a device of the type defined in the opening paragraph is characterized in that the means for generating pulses comprise clock means for generating clock pulses, the computing means comprise:

first adjusting means for adjusting a discharging time of the battery to a first value during discharging of the battery by the load and/or second adjusting means for adjusting a changing time of the battery to a second value during charging of the battery by the power-supply circuit under no-load condition, and time-measuring means for determining on the basis of the generated clock pulses the ratio between the elapsed discharging time and the adjusted discharging time and/or determining the ratio between the elapsed charging time and the adjusted charging time, which ratios represent the calculated charge status, and in that the device further comprises:

detection means for detecting at least one actual charge status of the battery during discharging and/or charging of the battery, correction means for correcting the computed charge status of the battery during discharging and/or charging of the battery, correction means for correcting the computed charge status and for correcting the first value of the first adjusting means and/or the second value of the second adjusting means when a difference occurs between said at least one actual charge status detected by the detection means and the computed charge status at the instant of detection, and control means for controlling the adjusting means and the time-measuring means. The operation of the device in accordance with the invention does not require the measurement of charging and discharging currents but is based on an adjusted and initially nominal discharging time and/or charging time for a given capacity of the battery. The charge status is determined by measuring the elapsed discharging time and/or charging time and expressing them as a fraction of the nominal discharging time and/or charging time. In order to preclude errors in the computed charge status due to deviations from the nominal values of, for example, the charging and/or discharging currents the computed charge status is compared with a measured actual charge status during the discharging and/or charging of the battery. In the case of a difference the computed charge status is corrected and the adjusted discharging or charging time is also corrected, so that during the next discharging or charging cycle of the battery the computed charge status will be closer in conformity with the actual charge status.

The device in accordance with the invention is therefore suitable for indicating the charge status either during discharging or charging of the battery and also for indicating the charge status both during discharging and charging of the battery.

In order to minimize possible deviations between the computed and the actual charge status of the battery in the case of comparatively slow charging processes, the computed charge status is compared with an actual charge status and, if necessary, corrected not only during discharging but preferably also at a specific instant during charging of the battery.

If the battery is charged very rapidly, for example in a few minutes, it may not be necessary for the user to have information on the charge status of the battery during charging. In such a case it is adequate to compare the computed charge status with an actual charge status of the battery and, if necessary, correct it only during discharging.

One embodiment may be characterized in that the detection means for detecting said at least one actual charge status during discharging of the battery comprise a first detection device for detecting a decrease of the battery voltage below a reference voltage.

Another embodiment may be characterized in that the detection means for detecting said at least one actual charge status during charging of the battery comprise a second detection device for detecting the substantially fully-charged condition of the battery. This embodiment may be characterized further in that the second detection device comprises a device for detecting a battery-voltage decrease which occurs when the battery is in the substantially fully charged condition. A further embodiment may be characterized in that the second detection device comprises a device for detecting whether the battery voltage is equal to a reference voltage.

Apart from determining the charge status during discharging of the battery by the load and during charging of the battery by the power-supply circuit under no-load conditions, the charge status may also be calculated and adapted in a number of other situations in order to ensure that the computed charge status agrees as far as possible with the actual charge status. For example, the charge status may also be computed in the situation in which the load is energized by the power-supply circuit, when also a specific charging current may be supplied to the battery. To this end an embodiment may be characterized in that the computing means further comprise third adjusting means for adjusting a charging time of the battery to a third value during charging of the battery by the power-supply circuit in its loaded condition.

When the battery is almost fully charged the usual power supply circuits change over to a trickle-charging mode. In this situation the charge status can be calculated if the device, in another embodiment, is characterized in that the computing means further comprise fourth adjusting means for adjusting a charging time of the battery to a fourth value during charging of the battery by the power-supply circuit in the no-load condition and when the battery is in the substantially fully charged condition.

The charge status may also be computed in the case of self-discharging of the battery. The device is then characterized in that the computing means further comprise fifth adjusting means for adjusting a discharging time of the battery to a fifth value during discharging of the battery when the power-supply circuit and the load are inoperative. If the power-supply circuit is suitable for briefly supplying a relatively large current so as to recharge the battery after it has been discharged almost completely, as rapidly as possible to such an extent that the load can be powered for at least one more use, the device in another embodiment may be characterized in that the power-supply circuit is adapted to supply a charging crrent to the battery for a fraction of the charging time. This charging current is larger than the charging current during the remaidder of the charging time of the battery. In this case the computing means further comprise sixth adjusting means for adjusting a charging time of the battery to a sixth value during charging of the battery with an increased charging current when the load is inoperative and the battery is substantially discharged.

A further embodiment of the invention may be characterized in that each of the adjusting means comprises a memory device for storing the adjusted value of the relevant adjusting means, in that the time-measuring means comprise:

and adjustable frequency divider for dividing the frequency of the clock pulses from the clock means depending on the value stored in the relevant adjusting means, and a memory device having a fixed number of storage locations for the storage of the number of clock pulses supplied by the frequency divider, which number represents the computed charge status.

In this embodiment the charge status is determined by filling a non-volatile memory with clock pulses of variable frequency during charging and vacating this memory during discharging, the frequency of said clock pulses being dictated by the value stored in the relevant adjusting means and corrected by the correction means.

This embodiment may be characterized further in that the first adjusting means comprise a first memory device for the storage of a first value, which represents the discharging time of the battery when discharged by the load, in that the second adjusting means comprise a second memory device for the storage of the second value, which represents the charging time of the battery by the power-supply circuit, and in that each of the other adjusting means comprises a memory device common to the first or second adjusting means, and means for connecting a fixed frequency divider in series with the programmable frequency divider.

Another embodiment of the invention may be characterized further in that each of the adjusting means comprises a memory device for storing the adjusted value of the relevant adjusting means, in that the time-measuring means comprise:

a memory device whose number of storage locations is proportional to the value stored in the relevant adjusting means and a frequency divider for dividing the frequency of the clock pulses by a fixed number. In this embodiment the charge status is determined in that a variable memory, whose storage capacity is dictated by the value stored in the relevant adjusting means and corrected by the correction means, is filled with clock pulses of a fixed frequency during charging and is vacated with clock pulses of a fixed frequency during discharging.

This embodiment may be characterized further in that the first adjusting means comprise a memory device for storing the first valve, in that the second adjusting means comprise a memory device for storing the second value, and in that each of the other adjusting means comprises a memory device common to the first or the second adjusting means for connecting a second fixed frequency divider in series with the said first frequency divider.

The indicator means of the device in accordance with the invention suitably comprises a passive electro-optical display device, in particular a liquid-cyrstal display device.

BRIEF DESCRIPTION OF THE DRAWINGS

Embodiments of the invention will now be described in more detail, by way of example, with reference to the accompanying drawings, in which.

DESCRIPTION OF THE PREFERRED EMBODIMENTS

Figure 1:
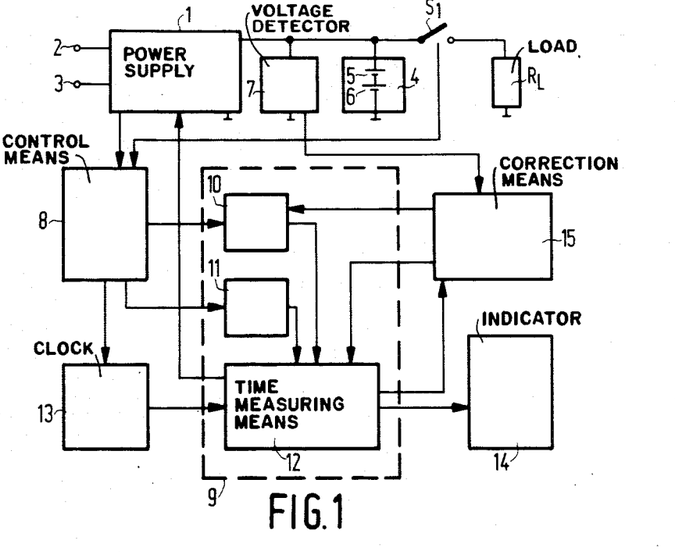
FIG. 1 shows a basic diagram of a device according to the invention.

FIG. 1 is the basic diagram of a device for indicating the charge status of a battery. The device comprises a power-supply circuit 1 with terminals 2 and 3 for applying a mains voltage, which may be an alternating voltage or a direct voltage. The power-supply circuit is, for example, a switched-mode power supply circuit is, for example, a switched-mode power supply as known from British Patent No. 2,000,394 or European patent application No. 30,026. A battery 4 is connected to the output of the power-supply circuit. In the present application "battery" is to be understood to means an assembly of one or more cells. In the present example the battery 4 comprises two nickel-cadmium cells 5 and 6 connected in series. By means of a switch $S_1$ a load $R_L$ can be connected in parallel with the battery 4. This load $R_L$ is, for example the motor of a dry-shaver. Furthermore, a device 7 is connected in parallel with the battery 4 to detect an actual charge status when the battery 4 is discharged. The device 7 detects for example whether the battery 4 is nearly empty by detecting a voltage level which corresponds to, for example, ten percent of the nominal battery capacity. The device 7 comprises, for example, a comparator which compares the battery voltage derived therefrom. It is to be noted that such detection devices are known per se, for example from U.S. Pat. No. 4,536,757 and from European patent application No. 115,625. When the mains voltage is applied and when the switch $S_1$ is open the power-supply circuit 1 supplies the charging current for the battery 4, which condition will be referred to hereinafter as "battery charging". If the power-supply circuit 1 is not connected to the mains and the switch $S_1$ is closed, the battery 4 supplies the supply current to the load $R_L$, which condition will be referred to hereinafter as "battery shaving". The device further comprises a number of devices 8 to 15 whose supply voltages are furnished by the battery 4.

The device comprises control means 8 which, on the basis of a signal providing information on whether the switch $S_1$ is closed or not and a signal providing information on whether the power-supply circuit 1 is connected to the mains or not, determines whether the battery-charging mode or the battery-shaving mode obtains.

The device also comprises computing means 9 comprising first adjusting means 10, second adjusting means 11 and time-measuring means 12. The first adjusting means 10 comprise a non-volatile and a volatile memory, the nonvolatile memory containing a value which dictates the nominal discharging time of the battery 4. When the device is put into use for the first time with a charged battery 4, each time when the device is put into use again after replacement of the battery, and in the case that the battery voltage decreases below the supply voltage required for the circuit elements, this value is stored in the volatile memory. The second adjusting means 11 only comprise a nonvolatile memory, which stores a value dictating the nominal charging time of the battery 4. Depending on the battery shaving or battery charging mode detected by the control means 8, the value stored in the first or in the second adjusting means is applied to the time-measuring means 12. In the battery shaving and battery charging modes clock pulses are supplied to the time-measuring means 12 by clock means 13. From the number of clock pulses the time-measuring means 12 determine the fraction which the elapsed discharging and charging times form of the total discharging time and charging time stored in the adjusting means 10 and 11 respectively.

The fractions as calculated by the computing means 9 are indicated by an indicator means 14, which may comprise any passive or active indicator means or a combination thereof. The relevant information may be represented in any form, for example alphanumerically or segmentarily.

The indicator means may be constructed so as to indicate the charge status not only during operation of the device but also for a definite or indefinite time after switching-off of the device. In the lastmentioned case the charge status of the battery may be indicated, for example, by an electro-optical indicator means during operation of the device and by an electro-acoustic indicator means after switching off. The electro-acoustic indicator means may produce, for example, a number of acoustic signals in conformity with the charge status of the battery. Obviously, it is also possible to indicate the charge status only after the device has been switched off.

During discharge of the battery 4 in the battery-shaving mode, the value which is stored in the volatile memory of the adjusting means 10 and which defines the discharging time of the battery 4 is applied to the time-measuring means 12. On the basis of the clock pulses supplied by the clock means 13 said means 12 express the dischare time which has elapsed as a fraction of the adjusted discharging time of the battery 4. This fraction forms the calculated charge status which is indicated by the indicator means 14.

The fraction as calculated by the computing means is also applied to the correctin means 15. These means also receive a detection signal from the detection means 7 which, as mentioned above, detects when a fraction of, say 10%, of the battery capacity is still left during discharge of the battery 4. If for whatever the reason the discharge current of the battery differs from the nominal discharge current, the residual fraction as calculated by the computing means 12 deviates from the actual residual fraction of the battery capacity as signalled by the detection means 7. The correction circuit 15 then corrects the fraction calculated by the computing means 12 and hence also the indication by the indicator means 14. Moreover, the correction means 15 correct the value stored in the volatile memory of the adjusting means 10, which value determines the discharge time of the battery 4 in such a way that driving the next-discharge of the battery 4 the calculated charge status comforms more closely to the actual charge status of the battery 4.

It is to be noted that instead of a voltage level corresponding to 10% of the battery voltage, the detection means 7 may detect any other voltage level. For example, the means 7 may detect the voltage level corresponding to the fully discharged condition of the battery 4.

When the battery 4 is charged the value which is stored in the adjusting means 11 by the control means 8, and which defines the nominal charging time of the battery 4, is applied to the time-measuring means 12. If the fraction calculated by the time-measuring means 12 on the basis of the clock pulses from the clock means 13 is unity, i.e. after the adjusted charging time, the time-measuring means 12 generate a signal which stops the power-supply circuit 1. The indicator means 14 then indicates that the battery 4 is fully charged.

Starting from a nominal charging time and discharging time per charging and discharging cycle a calculated and indicated charge status are compared in the above-described way with the actual charge status during discharging, the adjusted discharging time being each time corrected in such a way that the calculated and the actual charge status are in closer conformity with each other during the next charging and discharging cycle.

Figure 2:
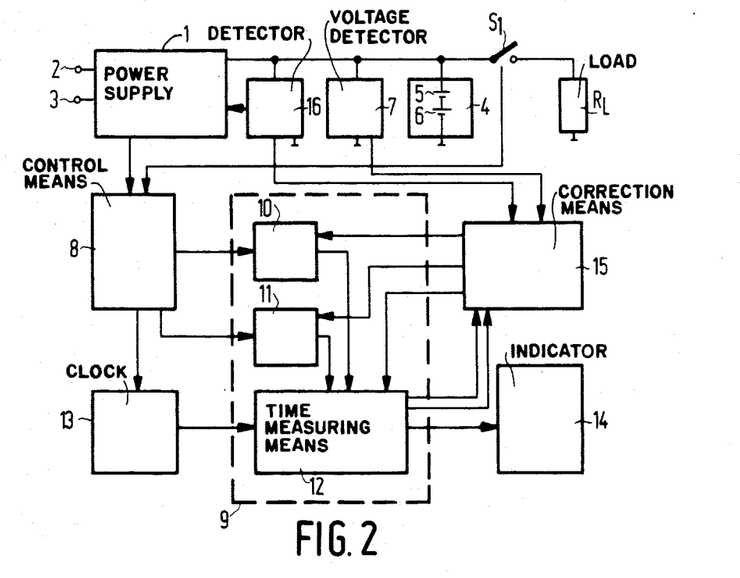
FIG. 2 shows an extension of the diagram of FIG. 1.

FIG. 2 shows an extension of the diagram of FIG. 1. The device not only comprises a detection device 7 for detecting an actual charge status during discharging, but also a detection device 16 for detecting an actual change status during charging of the battery 4. The detection device 16 comprises for example a means which detects whether the battery 4 is substantially fully charged. To achieve this several methods are known, such as detection of a specific battery voltage, detection of a maximum in the battery voltage by detecting a change of sign of the first derivative of the battery voltage with respect to time or by detecting a decrease of the battery voltage, detecting a change of sign of the second derivative of the battery voltage with respect to time or detecting a sudden temperature rise occurring when the battery is overcharged. Such methods are described in, for example, U.S. Pat. No. 4,392,101. Upon detection of the battery 4 being substantially fully charged the detection device 16 generates a signal which causes the power-supply circuit 1 to be disconnected.

The second adjusting means, like the first adjusting means 10 now comprise a non-volatile and a volatile memory, a value determining the nominal charging time of the battery 4 being stored in the non-volatile memory. When the device is put into use for the first time, when it is put into use again after replacement of the battery 4, or after the electronic circuits have been inoperative due to too low a battery voltage, the value is transferred from the non-volatile memory into the volatile memory. During discharging of the battery 4 the device operates in the same way as described with reference to FIG. 1. During charging the value stored in the volatile memory of the adjusting means 11, which value determines the charging time of the battery 4, is applied to the time-measuring means 12 under control of the control means 8. On the basis of the clock pulses from the clock means 13 these means 12 express the elapsed charging time of the battery 4 as a fraction of the adjusted charging time of the battery 4. This fraction again forms the calculated charge status as indicated by the indicator means 14.

If the charging current deviates from the nominal charging current, the fraction calculated by the calculating means 12 does not correspond to the situation at the instant at which the detection means 16 detect that the battery 4 is substantially fully charged. In that case the correction circuit 15 corrects the calculated fraction, thereby also ensuring that the indicator means 14 indicates that the battery 4 is fully charged. Moreover, the correction means 15 correct the value stored in the volatile memory of the second adjusting means 11, which value denotes the charging time of the battery 4, in such a way that the next time that the battery 4 is charged the calculated charge status is in closer conformity with the actual status of the battery 4.

Thus, the device of FIG. 2 compares a calculated and an indicated charge status with each other for each discharging and charging cycle both during charging and discharging, the adjusted charging and discharging times being corrected in the case of deviations in such a way that during the next discharging and charging cycle the calculated and the actual charge status are in closer conformity with each other.

Figure 3:
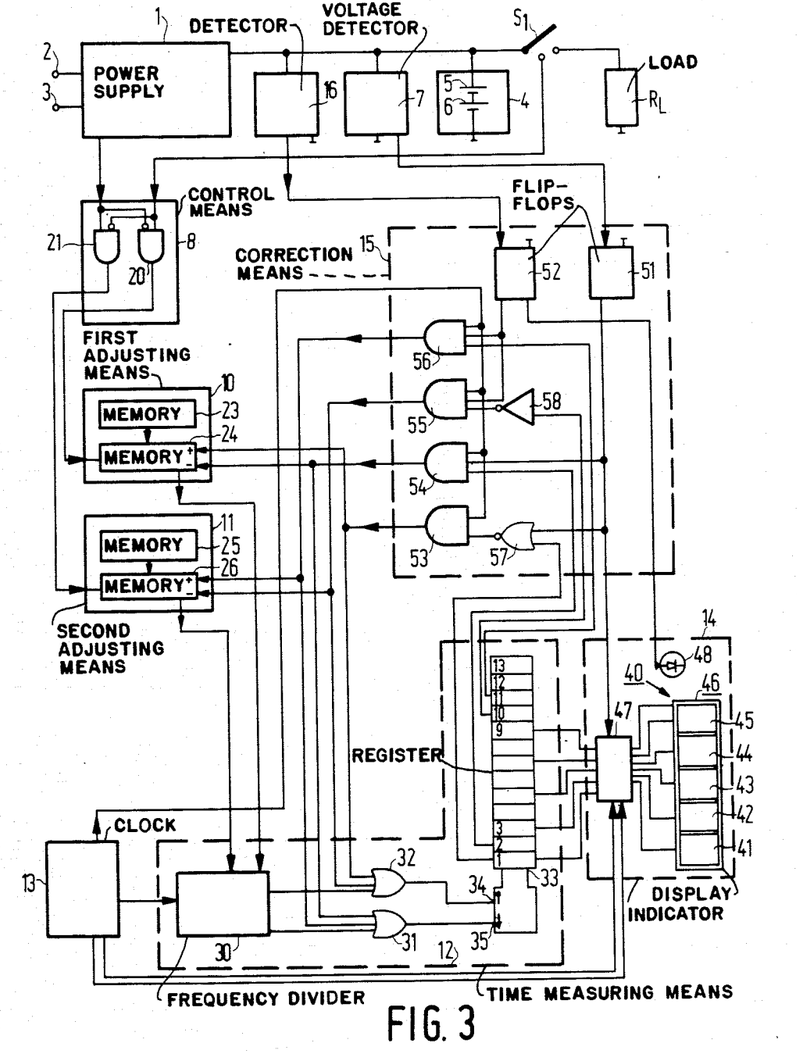
FIG. 3 shows a first embodiment based on the circuit of FIG. 2.

FIG. 3 shows an embodiment of the device in FIG. 2, identical parts bearing the same reference numerals.

The control means 8 comprise a first AND-gate 20 and a second AND-gate 21, each comprising an inverting input and a non-inverting input. A signal which is high when the switch $S_1$ is closed is applied to the non-inverting input of the gate 20 and to the inverting input of the gate 21 and a signal which is high when the power-supply circuit 1 is connected to the mains is applied to the inverting input of the gate 20 and to the non-inverting input of the gate 21. Consequently, the AND-gate 20 supplies a signal to the first adjusting means 10 in the battery-shaving mode and the AND-gate 21 supplies a signal to the second adjusting means 11 in the battery-charging mode.

The adjusting means 10 comprise a read-only memory 23 which stores a value which determines the nominal charging time of the battery 4 and a read-write memory 24, into which the value from the read-only memory 23 is written by a reset pulse each time that the device becomes operative and into which a value corrected by the correction means 15 is written when the device is in operation. The manner in which the reset pulse is generated is not described for the sake of simplicity. The adjusting means 11 are constructed in the same way as the adjusting means 10 and comprise a read-only memory 25 in which a value is stored which represent the nominal charging time of the battery 4 and a read-write memory 26 into which the value from the read-only memory 25 is written when there is a reset pulse and into which a corrected value is written when the device is in operation. The read-only memories 23 and 25 comprise, for example, an aluminium conductor pattern, whereas the read-write memories 24 and 26 comprise, for example, shift registers.

The computing means 12 comprise a memory in the form of a shift register 33, in the present example a 13-bit register in which the calculated charge status is stored. During charging of the battery 4 clock pulses from a frequency divider 30 are applied to the input 34 of the register via an OR-gate 32, which pulses each time increment the contents of the shift register by one bit. The situation in which the bits 1 to 10 contain a logic "1" corresponds to a fully charged battery. The bits 11, 12 and 13 are overflow bits which will be discussed below. During discharge of the battery 4 clock pulses from the frequency divider 30 are applied to an input 35 of the shift register 33 via an OR-gate 31, which pulses each time decrement the contents of the shift register by one bit. The frequency divider 30 is a programmable frequency divider in which the frequency of the clock pulses supplied by the clock means 13 is divided by a number which is stored in the read-write memory 24 of the first adjusting means 10 in the battery-shaving mode and is divided by a number which is stored in the read-write memory 26 of the second adjusting means 20 in the battery-charging mode. Such frequency dividers are known per se and are not described in more detail.

The clock means 13 comprise an oscillator for generating pulses and a number of fixed frequency dividers for deriving from these pulses the various clock frequencies required in the device. Similar clock means are well-known and therefore are not described in more detail.

The correction means 15 comprise a fip-flop 51 which is triggered by a detection signal from the detection means 7. The output of said flip-flop is connected to an input of a NOR-gate 57 whose other input is connected to the first bit of the register 33 and whose output is connected to one input of an AND-gate 53, whose other input is connected to the clock means 13 and whose output is connected both to the count-up (+) input of the read-write memory 24 and to an iput of the OR-gate 32. The output of the flip-flop 51 is also connected to a first input of an AND-gate 54, whose second input is connected to the second bit of the register 33, whose third input is connected to the clock means 13 and whose output is connected both to the count-down (−) input of the read-write memory 24 and to an input of the OR-gate 31. The correction means 15 further comprise a flip-flop 52 which is triggered by a detection signal from the detection means 16. One output is connected to a first input of an AND-gate 56 whose second input is connected to the 11th bit of the register 33, whose third input is connected to the clock means 13 and whose output is connected both to the count-up (+) input of the read-write memory 26 and to an input of the OR-gate 31. The output of the flip-flop 52 is also connected to a first input of an AND-gate 55, whose second input is connected to the clock means 13, whose third input is connected to the output of an inverter 58 whose input is connected to the 10th bit of the register 33. The output of AND gate 55 is connected to both the count-down (−) input of the read write memory 26 and to an input of the OR-gate 32.

In the present embodiment the indicator means 14 comprises a liquid-crystal display mean 40 with a bargraph with segment electrodes 41 to 45 and a back electrode 46. These electrodes 41 to 46 are driven by a driver circuit 47 in response to signals from the odd bits 1 to 9 of the shift register 33 of the computing means 12. The clock pulses for this driver circuit 47 are generated by the clock means 13. The segments 41 to 45 successively indicate the following charge statuses of the battery 4, again expressed in percentages of the battery capacity.

| segment no. | % C |
| --- | --- |
| 41 | 10-30 |
| 42 | 30-50 |
| 43 | 50-70 |
| 44 | 70-90 |
| 45 | 90-100 |

Moreover, the segment 41 starts to blink in the rhythm of a low-frequency clock signal applied to the driver circuit 47 by the clock means 13 if the driver circuit 47 receives a signal from the detection means 7 via the flip-flop 51 when the 10%-level is passed. It is also possible to represent the percentages separately or inscribed in the segments, for example in the sequence of 20, 40, 60, 80 and 100%. The dicator means further comprise a light-emitting diode (LED) 48 to indicate charging of the battery 4. This LED is driven by a signal on the inverting output of flip-flop 52. When the battery 4 is fully charged, the flip-flop 52 is triggered by the detection means 16, causing LED 48 to be turned off.

It is also possible to have the segment 45 blink when the battery 4 is almost fully charged in the same way as having the segment 41 blink when the battery is nearly empty.

It is also possible to provide the liquid-crystal display means 40 with extra electrodes in the form of letters and/or signs to indicate that the battery is nearly empty or nearly full or to indicate that the battery 4 is being charged or discharged.

The operation of the device may be explained as follows. It is assumed that the battery 4 is fully charged, the bits 1 to 10 of the register 33 containing a logic "1" and the segments 41 to 45 of the display means 40 being visible. When the power-supply circuit 1 is not connected to the mains the battery-shaving mode is obtained by closing the switch $S_1$. The AND-gate 20 of the control means 8 then supplies signal which causes the value stored in the read-write memory 24 to he applied to the programmable frequency divider 30. After a number of clock pulses from the clock means 13 as determined by this value, a clock pulse appears on an output of the frequency divider 30 and is applied to the input 35 of the register 33 via the OR-gate 31. This causes the 10th bit of the register 33 to change to a logic "0". With the next clock pulse generated by the frequency divider 30 the 9th bit changes to a logic "0", the top segment 45 of the display means 40 being turned off via the driver circuit 47. In this way the contents of the shift register 33 is each time decremented by one bit.

If the discharging current is larger and, consequently, the discharging time of the battery is shorter than the discharging time represented by the value in the read-write memory 24, the register 33 is decremented too slowly. At the instant at which the detection means 7 detects that the 10%-level is passed, a number of bits in the register 33 still contain a logic "1". It is assumed that the bits 1, 2 and 3 contain a "1". The "1" in the 2nd bit and the output signal of flip-flop 51 open the AND-gate 54, which causes a clock pulse to be applied to the input 35 of the register 33 via the OR-gate 31, which sets the 3rd bit to "0". The same clock pulse is applied to the count-down input of the read-write memory 24, which causes the value stored therein to be decremented by 1. The next clock pulse is aso applied to the input 35 of the register 33 via the AND-gate 54 and the OR-gate 31, which causes the 2nd bit to be set to "0", said pulse also being applied to the countdown input of the memory 24, so that the value stored is again decremented by 1. Only the 1st bit of the charging register 33 now contains a logic "1", which is in agreement with the detection means 7. This correction also results in a correction of the indication of the liquid-crystal display means 40, so that the segment 41 will blink to indicate that the battery 4 is nearly empty.

Since the value of the number stored in the read-write memory 24 has been decreased, the calculated charge status will be closer in conformity with the charge status during the next discharge period of the battery 4.

When the discharge current is smaller and the discharge time of the battery 4 is longer than the discharge time represented by the value in the read-write memory 24, the contents of the register 33 is decremented too fast. The 1st bit of register 33 is then set to "0" by a clock pulse from the frequency divider 30 before the passage of the 10%-level is detected by the detection means 7. In that case the AND-gate 53 is opened via the NOR-gate 57, which causes a clock pulse to be applied to the input 34 of the register 33 via the OR-gate 32, which sets the 1st bit to "1". This clock pulse is also applied to the count-up (+) input of the read-write memory 24, which causes the value stored therein to be incremented by "1". This is repeated until the flip-flop 51 is triggered by the detection means 7. Since the value of the number stored in the memory 24 has been incremented, the calculated charge status during the next discharging period will be closer in conformity with the actual charge status of the battery 4.

For an explanation of the operation of the device during the charging process it is assumed that the battery 4 is nearly empty. When the Dwer-supply circuit 1 is connected to the mains and the switch $S_i$ is opened, the value stored in the read-write memory 26 is a to the programmable frequency divider 30 in response to the AND-gate 21. After a number of clock pulses determined by this value, the frequency divider 30 each time generates a clock pulse which is applied to the input 34 of the register 32 via the OR-gate 32, causing the contents of this register 33 to the incremented by one bit.

If the charging time of the battery 4 is shorter than the charging time represented by the value in the memory 26, the contents of the register 33 is incremented too slowly, so that at the instant at which the detection means 16 detects that the battery 4 is nearly fully charged the 10th bit of register 33 is still "0". This bit signal is inverted by the inverter 58 and applied to the AND-gate 55, which also receives the output signal of the flip-flop 52, so that a clock pulse appears on the output of the AND-gate 55. This pulse is applied to the input 34 of the register 33 via the OR-gate 32 so that the contents of this register is incremented by one bit. The aforesaid pulse is also applied to the count-down (−) input of the readwrite memory 26 so that the value stored in this memory is decremented by one. This is repeated until the 10th bit of the register 33 is a "1" in accordance with the full-detection by the detection means 16.

If the charging time of the battery 4 is longer than the charging time represented by the value in the memory 26, the contents of the register 33 is incremented too rapidly, so that at the instant at which the detection means 16 detects the fully charged condition one or more of the bits 11, 1 and 13 contain a logic "12." Triggering of the flip-flop 52 causes the AND-gate 56 to be opened so that a clock pulse appears on its output. This pulse is applied to the input 35 of register 33 via the OR-gate 31, which causes the contents of this register to be decremented by one bit, said pulse also being applied to the count-up input the read-write memory 26, which causes the value stored therein to be incremented. This is repeated until the 11th is "0".

The correction of the value stored in the memory 26 ensures that the calculated charge status is in closer conformity with the actual charge status of the battery 4 during the next charging process.

Figure 4:
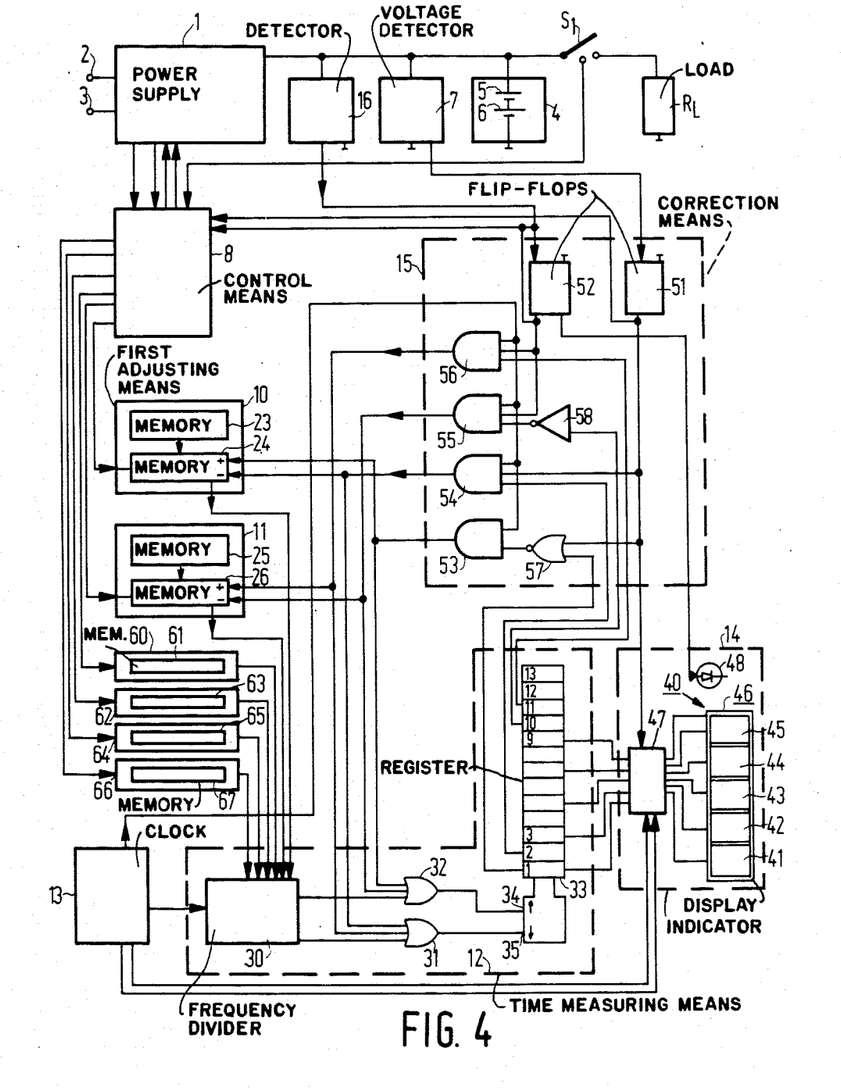
FIG. 4 shows a second embodiment of the invention.

FIG. 4 shows a second preferred embodiment based on the embodiment shown in FIG. 3, similar parts bearing the same reference numerals.

In the device of FIG. 3 a calculation of the charge status of the battery 4 occurs in the battery-charging mode, in whic the power-supply circuit 1 is connected to the mains and the switch $S_1$ is opened and in the battery-shaving mode in which the power-supply circuit 1 is not connected to the mains and the switch $S_1$ is closed. In all the other possible modes no calculation and adaptation of the charge status is effected.

In the device of FIG. 4 the charge status of the battery is also calculated in these other modes. Moreover, in the device of FIG. 4 the power-supply circuit 1 is of the type that can charge the battery in the nearly empty condition with a relatively large charge current for a fixed time, so that the battery-shaving mode becomes available after a short lapse of time. Such a power-supply circuit is known from British patent application No. 2,125,641.

When the power-supply circuit 1 is connected to the mains and the switch $S_1$ is closed, the power-supply circuit delivers a current to the load $R_L$ and also a relatively small current to the battery 4 if the battery voltage is lower than the value at which the voltage across the motor $R_L$ is stabilised. As a rule, this voltage is some tenths of volts lower than the battery voltage detected by the detection means 16 in the fully charged condition. When peak loads are ignored, the current supplied by the power-supply circuit 1 is generally larger than the current necessary to maintain the voltage across the motor $R_L$ at the stabalised value. The battery 4 is charged by the difference between these currents. This condition is referred to as the mains-shaving mode. The device comprises third adjusting means 60 comprising a read-only memory 61 in which a value is stored which represents the charging time of the battery 4 in the mains-shaving mode. When this mode is detected by the control means 8 from the signal from the power-supply circuit 1 which indicates connection to the mains and from the signal indicating that the switch $S_l$ is closed, the value stored in the memory 61 is applied to the programmable frequency divider 30. After a number of clock pulses of the clock means 13 determined by this value, this frequency divider 30 each time generates a clock pulse, which is applied to the input 34 of register 33 via the OR-gate 32, causing the contents of the register to be incremented by one bit. When the battery voltage becomes equal to the stabilised motor voltage, the power-supply circuit 1 is rendered inoperative until the battery voltage has decreased below the stabilised motor voltage.

If in the battery-charging mode the nearly fully charged condition of the battery 4 is detected by the detections means 16, power-supply circuits of the type currently used change over to a trickle-charging mode, in which the battery 4 is charged with a relatively small trickle of charging current to keep the battery in the fully charged condition.

The device is provided with a fourth adjusting means 62, comprising a read-only memory 63, in which a value is stored which represents the charging time of the battery 4 required for fully charging the battery with the trickle-charging current.

When the trickle-charging mode is detected by the control means 8 from the signals indicating the battery-charging mode and the output signal of the flip-flop 52, the power-supply circuit 1 is changed over to trickle charging by the control means 8 and the value stored in the memory 63 is applied to the frequency divider 30. After a number of clock pulses from the clock means 13 determined by this value this causes the frequency divider 30 to supply a clock pulse to the input 34 of the register 33 via the OR-gate 32, so that the contents of this register is each time incremented by one bit.

If the power-supply circuit 1 is not connected to the mains and the switch S₁ is open, the battery 4 is drained slowly as a result of self-discharging. This condition is referred to hereinafter as "self-discharging". The device comprises fifth adjusting means 64 comprising a read-only memory 65, in which a value is stored, which represents the discharging time of the battery 4 in the case that it would be fully discharged by self-discharging. On detection of the self-discharging condition by the control means 8 the value stored in the memory 65 is applied to the programmable frequency divider 30. After a relatively large number of clock pulses from the clock means 13 this causes the frequency divider 30 to apply a clock pulse to the input 35 of register 33 via the OR-gate 31, so that the contents of this register is each time decremented by one bit.

As stated above, the power supply circuit 1 can supply a relatively large charging current. If the power-supply circuit 1 is connected to the mains, the switch S₁ is closed and the flip-flop 51 has been triggered by the detection device 7 due to the battery 4 being nearly empty, the power-supply circuit 1 is changed over to the quick-charging mode by the control means 8. The power-supply circuit 1 then supplies a relatively large charging current for a relatively short time. During this time the battery 4 is charged to such an extent that energy is available for at least one shave. The device comprises sixth adjusting means 66 comprising a read-only memory 67 in which a value is stored which represents the charging time of the battery 4 in the case that it would be fully charged by the quick-charging current. In the quick-charging mode the value stored in memory 66 is applied to the frequency divider 30. After a relatively small number of clock pulses determined by this value, this each time causes the frequency divider 30 to supply a clock pulse to the input 34 of register 33 via the OR-gate 32, so that the contents of this register is each time incremented by one bit.

At a given moment the battery voltage will decrease below the minimum supply voltage required for the electronic circuits when the battery 4 is discharged furter after a passage of the 10%-level has been detected by the detection means, so that said circuits become inoperative. When the battery 4 is subsequently charged with the increased charging current, the device will become operative again above a certain battery voltage. The segment 41 of the indicator means 40 then blinks until the battery voltage has increased above the 10%-level.

It is to be noted that it is not necessary to apply all the adaptations of the calculation of the charge status of the battery as described with reference to FIG. 4. For example the influece of self-discharging of the battery on the charge status may be nored if this self-discharging effect is very small. In such a case the read-only memory 64 may be dispensed with. It is also possible to combine the read-only memories 60 and 62 to form one memory if the charging current in the trickle-charging mode is of the same order of magnitude as in the mains-shaving mode.

Figure 5:
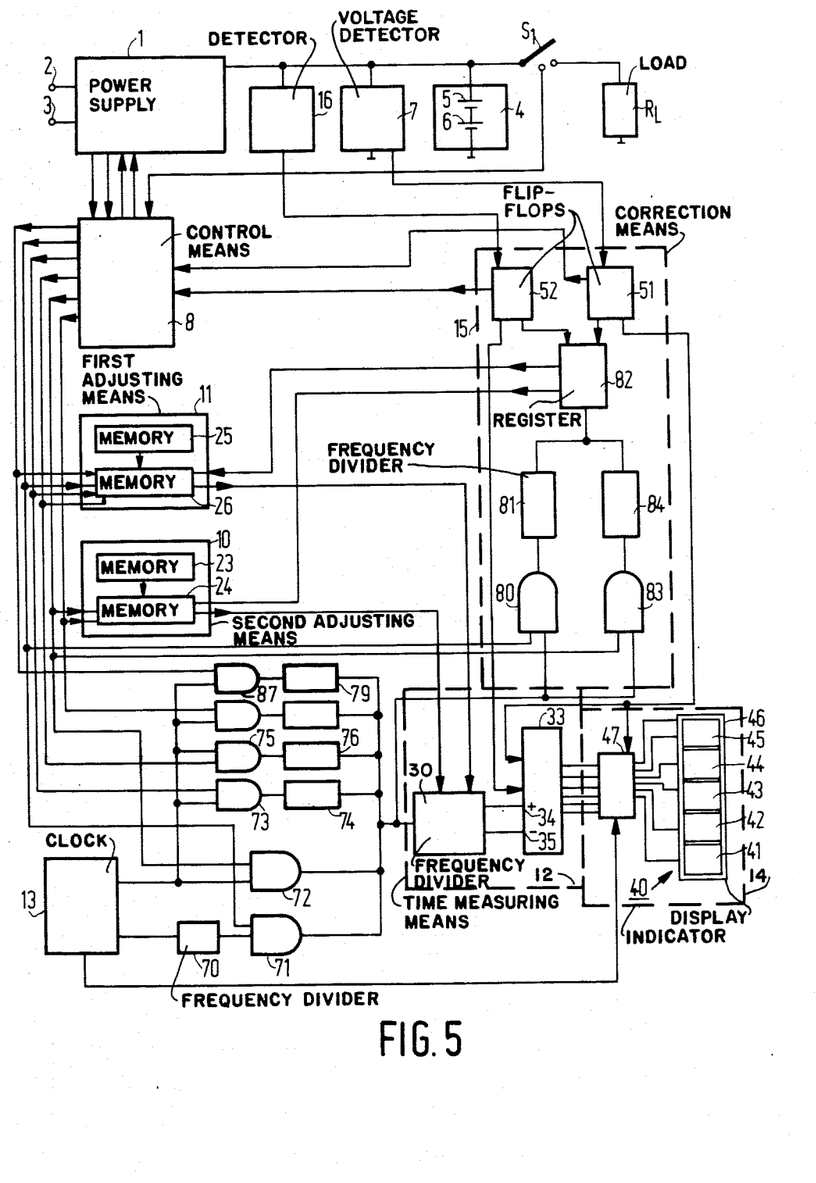
FIG. 5 shows a third embodiment of the invention.

FIG. 5 shows a device for indicating the charge status of a battery in accordance with a third embodiment, identical parts bearing the same reference numerals as in FIG. 4. The adjusting means 10 again comprise a read-only memory 23 in which a value representing the nominal discharging time of the battery is stored and a read-write memory 24 into which the value from the read-only memory 23 is entered each time that the device becomes operative and which during operation of the device stores a value corrected by the correction means 15. The adjusting means 11 are of the same construction as the adjusting means 10, the read-only memory 25 storing a value representing the nominal charging time of the battery 4 and the read-write memory 26 being loaded with the value from the read-only memory 25 when the device becomes operative and with a value corrected by the correction means 15 when the device is in operation. The computing means 12 again comprise a programmable frequency divider 30 and a register 33 which stores the computed charge status. In the present embodiment the register 33 is, for example, a 36-bit register. The indicator means 14 is of the same construction as that in the embodiment shown in FIG. 4, except that now the driver circuit 47 drives a succeeding segment electrode of the liquid-crystal display means 40 after every 8 clock pulse applied to the register 33 starting from the empty condition. In the present embodiment the segments 41 to 45 respectively correspond to 20, 40, 60, 80 and 100% of the battery capacity. The following table gives the relationship between the contents of the register and the number of segment electrodes being driven.

| number of bits stored in register | Segment No. |
| --- | --- |
| 0–7 | 41 |
| 8–15 | 41, 42 |
| 16–23 | 41 to 43 |
| 24–31 | 41 to 44 |
| 32–36 | 41 to 45 |

The segment 41 moreover starts to blink in the rhythm of a low-frequency signal supplied to the driver circuit by the clock means 13 if, upon passage of the 10% level, the detection means 7 supply a signal to the driver circuit via the flip-flop 51.

To explain the operation of the device in the battery-shaving mode it is assumed that the battery 4 is fully charged so that the bits 0–36 of the register 33 contain a logic "1" and the segments 41 to 45 are driven. In the battery-shaving mode the value stored in the read-write memory 24 is transferred to the programmable frequency divider 30 in response to a signal from the control means 8. Moreover, the signal from the control means 8 is applied to an AND-gate 72, as a result of which clock pulses from the clock means 13 are applied to the programmable frequency divider 30. After a number of clock pulses determined by the value in the memory 24, a clock pulse is applied to the count-down input 35 of the register 33 so that the 36th bit changes to a logic "0". As is apparent from the above Table, the segment 45 of the display means 40 is turned off after five clock pulses from the divider 30 and subsequently a following segment is turned off after every eight clock pulses from the frequency divider 30. The clock pulses applied to the frequency divider 30 are also fed to a fixed frequency divider 84 via an AND-gate 83, which divider 84 divides the frequency of the incoming pulses by a value equal to the number of bit positions of the register 33, i.e. 36 in the present example. The output pulses of the frequency divider 84 are applied to a register 82. At the instant at which the detection means detects a passage of the 10% level a signal from the flip-flop 51 causes the contents of the register 82 to be transferred to the read-write memory 24. When it is assumed that upon the detection of the 10%-level the contents of the register 33 is in conformity with this situation, i.e. all the 36 bit positions contain a logic "0", the value from the memory 24 applied to the frequency divider 30 is correct. It is then evident that the contents of the register 82 is the same as the contents of the memory 24. Therefore, the contents of the memory 24 is not corrected. If the discharging time of the battery 4 is now, for example, shorter than the discharging time represented by the value in the memory, the contents of the register is decremented too slowly. At the instant at which the detection means 7 detects a passage of the 10% level some of the bits of the register 33 are still "1". By means of the flip-flop 51 all the bits of the register 33 are set to logic "0", so that the segment 41 starts to blink. Until this instant a number of pulses has been applied to the register 82, which is equal to the value from the memory 24 multiplied by the number of bits which are logic "0" expressed as a fraction of the total number of bits of the register 33. The contents of the register 82 is written into the read-write memory 24. In this way the value of the number stored in the read-write memory 24 is decremented, so that in the next discharging period of the battey 4 the contents of the register 33 is decremented more rapidly and, consequently, the computed and displayed charge status is in closer conformity with the actual charge status.

To explain the operation of the device in the battery-charging mode it is assumed that the battery 4 is almost empty. Under cntrol of the control means 8 the value stored in the read-write memory 26 is transferred to the programmable frequency divider 30. Clock pulses from the clock means 13, which for practical reasons are divided by means of a fixed frequency divider 70, are applied to the input of the divider 30 via an AND-gate 71. After a number of clock pulses determined by the value from the memory 26, the frequency divider 30 supplies a clock pulse to the count-up input 34 of the register 33, so that the first bit changes to a logic "1". As a result of this the bottom segment 41 chargs over from the blinking mode to the continuously turned-on mode. The segments 42 to 45 are driven each time that 8 clock pulses have been applied to the register 33.

The clock pulses applied to the frequency divider 30 are also aplied to a fixed frequency divider 81 via an AND-gate 80. The divider 81 divides the frequency of the incoming pulses by a fixed value which in the present example is equal to 31. The output pulses of the frequency divider 81 are applied to the register 82. At the instant at which the detection means 16 detects the fully-charged level the contents of the register 82 is loaded into the read-write memory 26 in response to a signal from the flip-flop 52. If it is assumed that the charging time of the battery 4 is, for example, shorter than the discharging time represented by the value in the memory 26, the contents of the register 33 is incremented too slowly. Upon detection of the fully-charbed level, some of the bits of the register 33 are still "0". By means of the flip-flop 52 all the bits of the register 33 are set to "1," so that all the segments of the display means 40 are driven. Until the detection of the fully charged level the register 82 receives a number of pulses equal to the value from the memory 26 multiplied by the number of bits with the logic "1" value expressed as a fraction of the value of the fixed frequency divider 81. As the contents of the register 82 is loaded into the memory 26, the contents of the register 33 is incremented more rapidly the next time that the battery is charged, so that the computed charge-status is then in closer conformity with the actual charge status.

The adjusting means which establish the charging or discharging time of the battery 4 in the other charging and discharging modes which are possible comprise a memory common to the first adjusting means 11 or the second adjusting means 12.

The adjusting means for the self-discharging mode cmprise the first adjusting means 10 and a fixed frequency divider 78 connected in series with the programmable frequency divider 30. In the self-discharging mode the value from the read-write memory 24 is applied to the frequency divider 30 under control of the control means 8. By means of an AND-gate 77 clock pulses from the clock means 13 are applied to the frequency dider 78 and subsequently to the frequency divider 30, so that after a number of clock pulses determined by the value from the memory 24 the contents of the register 33 is adapted and the value stored in the memory 24 is not corrected. The charging time of the battery 4 defined by the adjusting means for the self-discharging mode is modified by a correction of the value stored in the memory 24 for the battery-shaving mode.

The adjusting means for the quick-charging mode comprise the second adjusting means 11 and a fixed frequency divider 74 connected in series with the programmable frequency divider 30. In the quick-charging mode the value from the memory 26 is transferred to the programmable frequency divider 30. Clock pulses from the clock means 13 are applied to the frequency divider 74 via the AND-gate 73 and subsequently to the frequency divider 30, so that the contents of the register 33 is incremented each time after a number of clock pulses determined by the value from the memory 26. In a similar way, the adjusting means for the mains-shaving mode and trickle-charging mode comprise the second adjusting means 11 and the fixed frequency dividers 76 and 79 respectively. In the mains-shaving mode clock pulses are applied to the frequency divider 76 via the AND-gate 75 and in the trickle-charging mode these pulses are applied to the frequency divider 79 via the AND-gate 87, so that the contents of the register 33 is also adapted in these modes.

It is to be noted that in the embodiments described the functions performed by the circuits 8, 10, 11, 12, 14 and 15 may be realized by means of a microprocessor.

Figure 6:
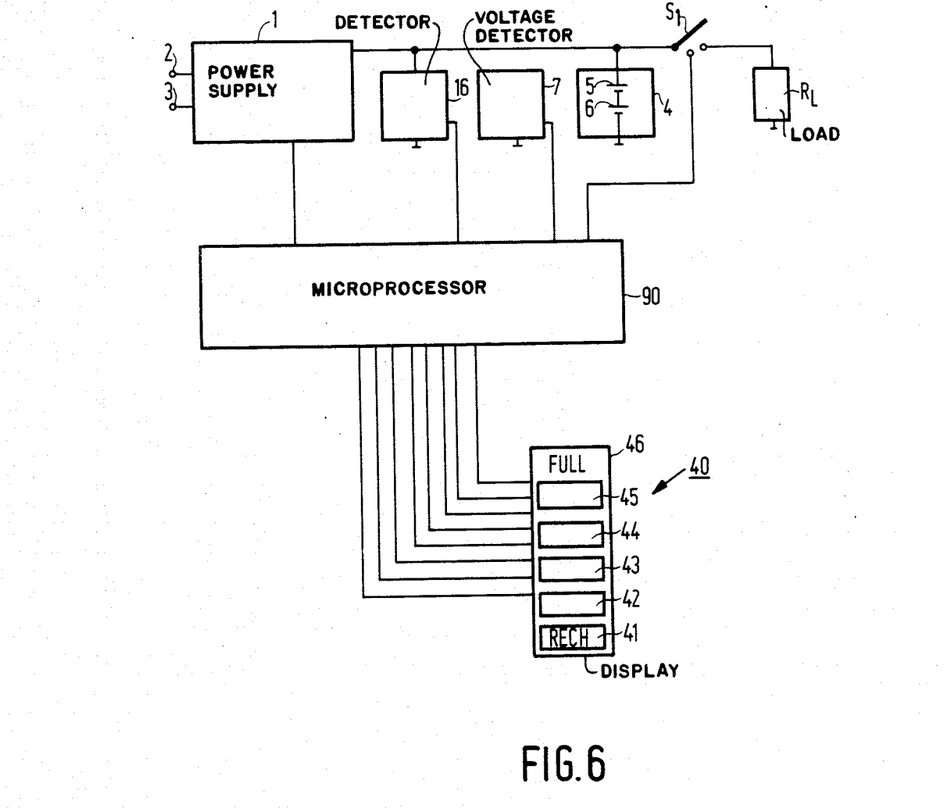
FIG. 6 shows a fourth embodiment of the invention.

FIG. 6 shows a fourth embodiment of the invention in which the functions of the control means, the adjusting means, the computing means and the correction means are performed by a microprocessor. The microprocessor is for example of the type Toshiba M 50.760-XXXP. This microprocessor requires a minimum supply voltage of 2 V, which is delivered by the battery 4. For the sake of simplicity the external components necessary for the correct operation of the microprocessor are not shown.

The display means 40 again comprises 5 segment electrodes 41 to 45. In the present example the segment electrode 41 displays fixed information in the form of the letters RECH. which denotes the fully discharged state of the battery 4 and, consequently, the need to recharge the battery 4. Above the segment electrode 45 a number of electrodes forming the words FULL are arranged, which when driven indicate that the battery is charged to substantially the full extent.

In the present example, the full battery capacity is divided in accordance with the scales $-10, 0, 20, 40, 60, 80$ and $100\%$. In this scale the segment electrodes 41 to 45, in this order, denote the ranges 0-20; 20-40; 40-60; 60-80 and 80-100%. In this scale the 0%-level corresponds to the condition in which the detection means 7 detect the level of 10% of the full capacity. When this level is detected the segment electrodes 41 will blink. When the battery 4 is discharged even furher, this segment electrodes 41 keeps blinking until the voltage level is reached below which the display means 40 no longer functions. This voltage level corresponds to the −10% level. At this level the fixed information RECH is displayed as a sign that the battery 4 must be recharged. In the present embodiment the detection means 16 detects a voltage level which on the display-means scale corresponds to the 80%-level. When this level is reached the charging current of the circuit 1 is set to the slow-charging level to charge the battery 4 completely within a predetermined time. When this level is detected all the segment electrodes and the FULL indication are driven. However, for computing the charge status the microprocessor 90 proceeds with the 80%-level. If the computed charge status is already higher prior to detection of the 80%-level, the display means continues to display the 80%-level until this level is detected.

A first read-only memory in the microprocessor 90 stores a value representing 1/10 of the nominal discharging time. When the device becomes operative in the battery-shaving mode this value is loaded into a counter formed by a part of the memory. This counter then counts down with clock pulses of a fixed frequency derived from the internal clock of the microprocessor. The microprocessor also comprises a charge register storing a number which may have values from 0 to 9. This value represents the computed charge status, which is displayed by the display means 40. When it is assumed that the battery 4 is fully charged, i.e. the charge register contains the number 9, the charge register is set to 8 after the counter has counted down to zero. Subsequently, the value from the first read-only memory is each time again applied to the counter, after which it counts down again until it is empty. If the detection means 7 detects the 10% level and the state of the charge register is unequal to zero at this instant, the processor computes a new value from the old values and the state of the charge register, which new value represents 1/10 of the discharging time. This new value is writeen into a first read-write register and is transferred to the counter during the next discharging process.

A second read-only memory in the microprocessor stores a value which represents 1/10 of the nominal charging time. In the battery-charging mode this value is applied to the counter when the device becomes operative, which counter again counts down until it is empty within response to clock pulses of a fixed frequency derived from the internal clock. When it is assumed that the battery 4 is almost empty, i.e. position 0 of the charge register, the charge register is now set to position 1. In this way the value stored in the second read-only memory is each time transferred to the counter in the battery-charging mode, which counter each time counts down until it is empty, resulting in the contents of the charge register being incremented by one each time. If the detection means 16 detects the 80% level and at this instant the state of the charge register is not 7, the processor derives a new value representing 1/10 of the charging time from the old value and the state of the charge register This new value is entered into a read-write memory. The next time that the battery 4 is charged, this value is each time applied to the counter. Adaptation of the computed charge status in the quick-charging, trickle-charging, mains-shaving and self-discharging modes can be realized simply in the present embodiment by vacating the counters with clock pulses of a different frequency.

The invention is not limited to the embodiments described herein, many modifications being conceivable to those skilled in the art within the scope of the invention. In the embodiments described the computed charge status during discharging and/or charging of the battery is compared with one actual charge status, after which the computed charge status is corrected. However, it is also possible to compare, andif necessary correct, the computed charge status during charging and/or discharging several times with an actual charge status.

What is claimed is:

1. A device for indicating the charge status of a battery during charging and/or discharging, comprising:
    a power-supply circuit for charging the battery and/or energizing a load;
    means for generating pulses during charging and/or discharging of the battery;
    computing means for computing the charge status on the basis of the generated pulses, and
    indicator means for indicating the computed charge status, characterized in that
    the means for generating pulses comprise clock means for generating clock pulses,
    the computing means comprise:
    first adjusting means for adjusting a discharging time of the battery to a first value during discharging of the battery by the load and/or second adjusting means for adjusting a charging time of the battery to a second value during charging of the battery by the power-supply circuit under no-load condition, and
    time-measuring means for determining, on the basis of the generated clock pulses, at least one of the following ratios, the ratio between the elapsed discharging time and the adjusted discharging time and the ratio between the elapsed charging time and the adjusted charging time, which ratios represent the calculated charge status,
    wherein the device further comprises:
    detection means for detecting at least one actual charge status of the battery during discharging and/or charging of the battery,
    correction means for correcting the computed charge status and for correcting at least one of said first and second values of the first and second adjusting means, respectively, when a difference occurs between said at least one actual charge status detected by the detection means and the computed charge status at the instant of detection, and
    control means for controlling the adjusting means and time-measuring means.

2. A device as claimed in claim 1, characterized in that the detection means for detecting said at least one actual charge status during discharging of the battery comprise a first detection device for detecting a decrease of the battery voltage below a reference voltage.

3. A device as claimed in claim 1, characterized in that the detection means for detecting said at least one actual charge status during charging of the battery comprise a detection device for detecting a substantially fully charged condition of the battery.

4. A device as claimed in claim 3, characterized in that the detection device comprises a device for detecting a battery-voltage decrease which occurs when the battery is in the substantially fully charged condition.

5. A device as claimed in claim 3, characterized in that the detection device comprises a device for detecting whether the battery voltage is equal to a reference voltage.

6. A device as claimed in claim 1, characterized in that the computing means further comprises third adjusting means for adjusting a charging time of the battery to a third value during charging of the battery by the power-supply circuit in its laded condition.

7. A device as claimed in claim 6, characterized in that
each of the adjusting means comprises a memory device for storing the adjusted value of the relevant adjusting means,
the time-measuring means comprise:
an adjustable frequency divider for diving the frequency of the clock pulses from the clock means depending on the value stored in the relevant adjusting means, and
a memory device having a fixed number of storage locations for the storage of a number of clock pulses supplied by the frequency divider, which number represents the computed charge status.

8. A device as claimed in claim 7, characterized in that
the first adjusting means comprise a first memory device for the storage of a first value, which represents the discharging time of the battery when discharged by the load,
the second adjusting means comprise a second memory device for the storage of the second value, which represents the charging time of the battery by the power-supply circuit, and
the third adjusting means comprises a memory device common to the first or second adjusting means, and means for connecting a fixed frequency divider in series with the adjustable frequency divider.

9. A device as claimed in claim 6, characterized in that
each of the adjusting means comprises a memory device for storing the adjusted value of the relevant adjusting means,
the time-measuring means comprise:
a memory device whose number of storage locations is proportioned to the value stored in the relevant adjusting means, and
a frequency divider for dividing the frequency of the clock pulses by a fixed number.

10. A device as claimed in claim 9, characterized in that
the first adjusting means comprise a memory device for storing the first value,
the second adjusting means comprise a memory device for storing value, and
the third adjusting means comprises a memory device common to the first or the second adjusting means for connecting a second fixed frequency divider in series with said fixed frequency divider.

11. A device as claimed in claim 1, characterized in that the computing means further comprises further adjusting means for adjusting a charging time of the battery to a further value during charging of the battery by the power-supply circuit in the no-load condition and when the battery is in the substantially fully charged condition.

12. A device as claimed in claim 1, characterized in that the computing means further comprise further adjusting means for adjusting a discharging time of the battery to a further value during discharging of the battery when the power supply circuit and the load are inoperative.

13. A device as claimed in claim 1, characterized in that the power-supply circuit is adapted to supply a charging current to the battery for a fraction of the charging time, which charging current is larger than the charging current during the remainder of the charging time of the battery, and in that the computing means further comprise further adjusting means for adjusting a charging time of the battery to a further value during charging of the battery with an increased charging current when the load is inoperative and the battery is substantially uncharged.

14. A device as claimed in claim 1, characterized in that the indicator means comprise a passive electro-optical display means.

15. A device as claimed in claim 14, characterized in that the indicator means comprise a liquid-crystal display means.

16. A device as claimed in claim 1, characterized in that the indicator means comprise an electro-acoustic indicator means.

17. A device as claimed in claim 1, characterized in that the indicator means comprise means for indicating the charge status of the battery after the device has been switched off.

18. A device as claimed in claim 1 characterized in that:
each of the adjusting means comprises a memory device for storing the adjusted value of the relevant adjusting means,
the time-measuring means comprise:
an adjustable frequency divider for dividing the frequency of the clock pulses from the clock means depending on the value stored in the relevant adjusting means, and
a memory device having a fixed number of storage locations for the storage of a number of clock pulses supplied by the frequency divider, which number represents the computed charge status.

19. A device as claimed in claim 1 characterized in that:
each of the adjusting means comprises a memory device for storing the adjusted value of the relevant adjusting means, and
the time-measuring means comprise:
a memory device having a number of storage locations proportioned to the value stored in the relevant adjusting means, and
a frequency divider for dividing the frequency of the clock pulses by a fixed number.

20. A dry-shaving apparatus comprising, a device as claimed in claim 1, a battery and a motor coupled to said battery via a switch.

21. A device for indicating the charge status of a battery comprising:
a power-supply circuit for charging the battery and/or energizing a load;
means for generating pulses during charging and discharging of the battery;
computing means for computing the battery charge status on the basis of the generated pulses, and indicator means for indicating the computed charge status, characterized in that
the computing means comprise:
first adjusting means for adjusting a discharge time of the battery to a first value during discharging of the battery by the load and second adjusting means for adjusting a charge time of the battery to a seocnd value during charging of the battery by the power-supply circuit under a no-load condition, and
time-measuring means for determining, on the basis of the generated pulses, a ratio between elapsed discharge time and the adjusted discharge time and for determining a ratio between elapsed charge time and the adjusted charging time, which ratios represent the calculated charge status,
wherein the device further comprises:
detection means for detecting at least one actual charge status of the battery during discharging and charging of the battery,
correction means for correcting the computed charge status and for correcting the first value of the first adjusting means and the second value of the second adjusting means when a difference occurs between said at least one actual charge status detected by the detection means and the computed charge status at the instant of detection, and
control means for controlling the adjusting means and time-measuring means.

22. A device for indicating the charge status of a battery during charging comprising:
a power-supply circuit for charging the battery,
means for generating pulses during charging of the battery;
adjusting means for adjusting a charging time of the battery to a first value during charging of the battery by the power-supply circuit under a no-load condition,
time-measuring means for determining, on the basis of the generated pulses, the ratio between the elapsed charging time and the adjusted charging time, which ratio represents the calculated charge status,
detection means for detecting at least one actual charge status of the battery during charging of the battery,
correction means for correcting the computed charge status and for correcting the first value of the adjusting means when a difference occurs between said at least one actual charge status detected by the detection means and the computed charge status at the instant of detection, and
control means for controlling the adjusting means and time-measuring means.

23. A device for indicating the charge status of a battery during discharging, comprising:
a power-supply circuit for energizing a load;
means for generating pulses during discharging of the battery;
adjusting means for adjusting a discharge time of the battery to a first value during discharging of the battery by the load,
time-measuring means for determining, on the basis of the generated pulses, the ratio between the elapsed discharging time and the adjusted discharging time, which ratio represents the calculated charge status,
detection means for detecting at least one actual charge status of the battery during discharging of the battery,
correction means for correcting the computed charge status and for correcting the first value of the adjusting means when a difference occurs between said at least one actual charge status detected by the detection means and the computed charge status at the instant of detection, and
control means for controlling the adjusting means and time-measuring means.

* * * * *